United States Patent [19]

Yabu

[11] Patent Number: 4,814,625
[45] Date of Patent: Mar. 21, 1989

[54] EXPOSURE APPARATUS HAVING GAS SUPPLYING MEANS FOR AIR BLOW OFF

[75] Inventor: Shuichi Yabu, Kawasaki, Japan
[73] Assignee: Canon Kabushiki Kaisha, Tokyo, Japan
[21] Appl. No.: 155,551
[22] Filed: Feb. 12, 1988

[30] Foreign Application Priority Data

Feb. 16, 1987 [JP] Japan .................. 62-31622

[51] Int. Cl.$^4$ ............................ G01N 21/86
[52] U.S. Cl. .................... 250/548; 356/401; 355/8
[58] Field of Search ............ 250/234, 548, 557; 356/399–401; 355/8, 53

[56] References Cited

U.S. PATENT DOCUMENTS

| | | | |
|---|---|---|---|
| 3,904,290 | 9/1975 | Kidd et al. | 355/8 |
| 4,503,335 | 3/1985 | Takahashi | 250/548 |
| 4,530,592 | 7/1985 | Green et al. | 355/8 |
| 4,720,732 | 1/1988 | Tsutsui | 355/53 |

*Primary Examiner*—David C. Nelms
*Assistant Examiner*—Stephone B. Allen
*Attorney, Agent, or Firm*—Fitzpatrick, Cella, Harper & Scinto

[57] ABSTRACT

An exposure apparatus having a movable stage for carrying thereon a workpiece such as a semiconductor wafer and a laser interferometer system for measuring the position of the stage with respect to X and Y directions, is disclosed. The movement of the stage is controlled on the basis of the position measurement by use of the laser interferometer system, so that a pattern of a mask or reticle is transferred onto different portions of the workpiece in a step-and-repeat manner. One or more air-conditioning devices are provided to supply currents of air, being controlled at the same temperature, toward the stage and along the measuring paths of the laser interferometer system which are in the X and Y directions. This is effective to avoid spatial temperature irregularities, particularly along the measuring paths, with the result that the measuring accuracy of the laser interferometer system can be improved remarkably. Thus, the step-and-repeat exposures can be made with higher correctness.

3 Claims, 2 Drawing Sheets

EXPOSURE APPARATUS HAVING GAS SUPPLYING MEANS FOR AIR BLOW OFF

FIELD OF THE INVENTION AND RELATED ART

This invention relates to an exposure apparatus, e.g., for use in the manufacture of semiconductor devices such as electronic microcircuits and, more particularly, it relates to a step-and-repeat type exposure apparatus usable for transferring a mask pattern onto each of different shot areas on a workpiece such as a. semiconductor wafer in a step-and-repeat manner while accurately and repeatedly positioning an X-Y table, carrying thereon the workpiece, by use of a laser interferometer.

Recent increases in the degree of integration of semiconductor integrated circuits have required the capability of formation of very fine patterns. In this connection, the accuracy of aligning a mask and a wafer has been and now is required to be increased more and more. For attaining higher alignment accuracy, very high precision of an order not more than 0.1 micron is required with respect to the positioning of an X-Y table which carries thereon a semiconductor wafer and which is repeatedly positioned for the step-and-repeat exposures of the wafer. Usually, one or more laser interferometers are used for detecting or measuring the position of the X-Y table.

It is known that, in the measurement using a laser interferometer, any change in the temperature of an air surrounding the laser interferometer results in an error in the measurement. In consideration of this, it has been proposed to use a temperature-controlled chamber and to place an exposure apparatus as a whole in such chamber so that a measuring system including a laser interferometer is used in a temperature-controlled state. Another proposal has been made in Japanese Laid-Open Patent Application, Laid-Open No. Sho61-136227. According to this proposal, an X-Y stage is disposed in a chamber which is separate from a chamber for accommodating therein a projection lens system. Temperature-controlled air is supplied into the chamber that accommodates the X-Y stage, such that the ambient temperature of the X-Y stage can be controlled independently of the temperature control for the projection lens system.

SUMMARY OF THE INVENTION

The inventor of the subject application has found that use of a temperature-controlled chamber may be insufficient for the accurate temperature control required with respect to the measurement using a laser interferometer. Namely, a semiconductor device manufacturing exposure apparatus includes various heat generation sources such as, for example, an X motor for driving an X-Y stage in an X direction, a Y-motor for driving the X-Y stage in a Y direction, an illumination system for supplying a light used for the exposure, etc. Therefore, even if such an X-Y stage is placed in a temperature-controlled chamber, it is not difficult to avoid spatial temperature irregularities within the chamber as a whole.

If there is a temperature irregularity along a path of measurement of the laser interferometer (i.e. the path along which a measuring laser beam travels), the "graduations" for the measurement may distort with a result of a measurement error adversely affecting the stop position of the X-Y stage.

It is accordingly a primary object of the present invention to provide an exposure apparatus wherein undesirable deterioration of the positioning accuracy due to the temperature irregularity can be avoided satisfactorily such that exposures can be effected with high accuracy.

In accordance with one preferred form of the present invention, an air-conditioning means is used which means is arranged to supply, to an X-Y stage, currents of air being controlled at the same temperature along two directions, respectively, which are substantially parallel to two measuring directions of a laser interferometer system (i.e. X and Y directions along which measuring lights are directed). This arrangement is effective to avoid temperature irregularities on the paths of the measuring light, in the X and Y directions, with the result that the occurrence of measurement errors can be prevented such that the poitioning accuracy for the X-Y stage can be improved remarkably.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
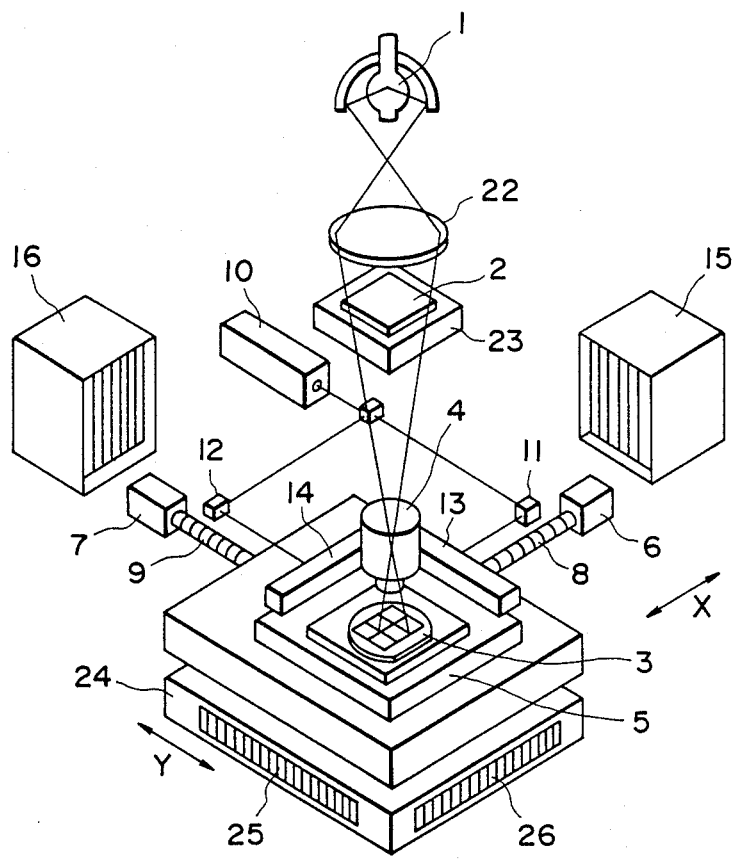
FIG. 1 is a perspective view schematically showing a semiconductor device manufacturing exposure apparatus according to one embodiment of the present invention.

Referring first to FIG. 1, there is shown a semiconductor device manufacturing exposure apparatus according to one embodiment of the present invention. The apparatus includes an illumination light source 1 which emits a light to be used for transferring a pattern of a mask 2 onto a semiconductor wafer 3. The apparatus further includes a projection optical system 4 for projecting an image of the pattern of the mask 2 upon one shot area on the wafer 3 at a time; an X-Y stage 5 for carrying thereon the wafer 3 and being movable in each of X and Y directions for allowing transfer of the mask 2 pattern onto different shot areas on the wafer 3 in a step-and-repeat manner; a driving motor 6 for moving the X-Y stage 5 in the X direction; another driving motor 7 for moving the X-Y stage 5 in the Y direction; a ball screw 8 adapted to transmit the X-direction drive of the motor 6 to the X-Y stage 5; another ball screw 9 adapted to transmit the Y-direction drive of the motor 7 to the X-Y stage 5; and a measuring unit 10 having a laser beam source providing a measuring laser beam. The measuring unit 10 includes a first interferometer 11 for the measurement with respect to the X direction, a second interferometer 12 for the measurement with respect to the Y direction, a first reflector 13 provided in relation to the measurement with respect to the X direction and a second reflector 14 provided in relation to the measurement with respect to the Y direction. The exposure apparatus further includes a pair of air-conditioning devices 15 and 16 which are provided, respectively, in relation to the measurements with respect to the X and Y directions, respectively.

In the apparatus shown in FIG. 1, the light (laser beam) emitted from a laser beam source included in the measuring unit 10 is introduced into both of the first and second interferometers 11 and 12. By the cooperation of the first interferometer 11 and the first reflector 13 which is fixed to the X-Y stage 5, the position of the X-Y stage 5 with respect to the X direction is measured or detected. On the other hand, by the cooperation of the second interferometer 12 and the second reflector 14 which is fixed to the X-Y stage 5, the position of the X-Y stage with respect to the Y direction is measured or detected. In accordance with the results of these measurements, the position of the X-Y stage is adjusted so that the wafer 3 is positioned with respect to a particular shot area thereon. After this, the particular shot area on the wafer 3 is exposed to the mask 2 pattern with the light supplied from the illumination light source 1.

The light from the light source 1 passes through a condenser lens 22 and illuminates the mask 2 which is held by a mask holder 23. Besides the condenser lens 22, there are provided, along the path of the illumination light between the light source 1 and the mask 2, a variety of optical components such as an optical integrator for assuring uniform illumination of the mask 2, a shutter mechanism for controlling the amount of exposure and so on, although they are not shown in the drawings. As described hereinbefore, the measuring unit 10, the interferometers 11 and 12 and the reflectors 13 and 14 provide one measuring system which is well known per se in the art. In the system illustrated, the measuring unit 10 is adapted to detect, by use of a detector (not shown), any interference of the laser beam having been projected upon the reflector 13 from the interferometer 11 in a direction parallel to the X direction and coming back to the interferometer 11. Also, the measuring unit 10 is adapted to detect, by use of a detector (not shown), any interference of a laser beam having been projected upon the reflector 14 from the interferometer 12 in a direction parallel to the Y direction and coming back to the interferometer 12. On the basis of the detection with respect to the X and Y directions, the measuring unit 10 measures or detects the position of the X-Y stage 5 with respect to each of the X and Y directions.

In the present embodiment, as seen in FIG. 1, the ball screws 8 and 9 which are coupled, respectively, to the driving motors 6 and 7 for moving the X-Y stage 5 in the X and Y directions, respectively, are provided in parallel to the X and Y directions, respectively. Further, the first air-conditioning device 15 is arranged to send, to the X-Y stage 5 and along the X direction, a current of air being controlled at a predetermined temperature. On the other hand, the second air-conditioning device 16 is arranged to send, to the X-Y stage 5 and along the Y direction, a current of air being controlled at a predetermined temperature. Additionally, below a base member (not shown) on which the X-Y stage 5 is placed, there is provided a suction device denoted generally at 24 in FIG. 1. The suction device 24 is adapted to collect, by suction and at an opening 25, the air having been blown from the air-conditioning device 15 in the X direction and having passed about the X-Y stage 5, and also to collect, by suction and at an opening 26, the air having been blown from the air-conditioning device 16 in the Y direction and having passed about the X-Y stage 5. The suction device 24 is also arranged to discharge the collected air to the outside of a chamber, not shown, in which the entire structure of the exposure apparatus is accommodated. The blow-off opening of each of the air-conditioning devices 15 and 16 is arranged so that the path of the laser beam (measuring light path) between the corresponding interferometer 11 (or 12) and the corresponding reflector 13 (or 14) is positioned within the flow of the air discharged from the blow-off opening. Thus, by the air collecting function of the suction device 24 described hereinbefore, the currents of air from the air-conditioning devices 15 and 16 can flow in parallel to or substantially in parallel to the X and Y directions, respectively, substantially without any interference. The necessary control for achieving the above-described supply of currents of air and collection of the flowing air can be effected under the influence of a computer, not shown. Further, the temperature of the air flows from the air-conditioning devices 15 and 16 may be controlled independently of each other on the basis of temperature sensors which may be provided in the neighborhood of the blow-off openings of the air-conditioning devices 15 and 16, respectively.

The first and second air-conditioning devices 15 and 16 may operate to send currents of air, being controlled at the same temperature, to the X-Y stage 5 along the X and Y directions, respectively. This substantially avoids any spatial irregularity in the air temperature along (i) the X-direction measuring light path between the first interferometer 11 and the first reflector 13 and (ii) the Y-direction measuring light path between the second interferometer 12 and the second reflector 14. As a result, whatever position the X-Y stage takes in the X-Y plane, the position of the X-Y stage can be measured or detected substantially without error, and therefore, it can be positioned correctly.

Figure 2:
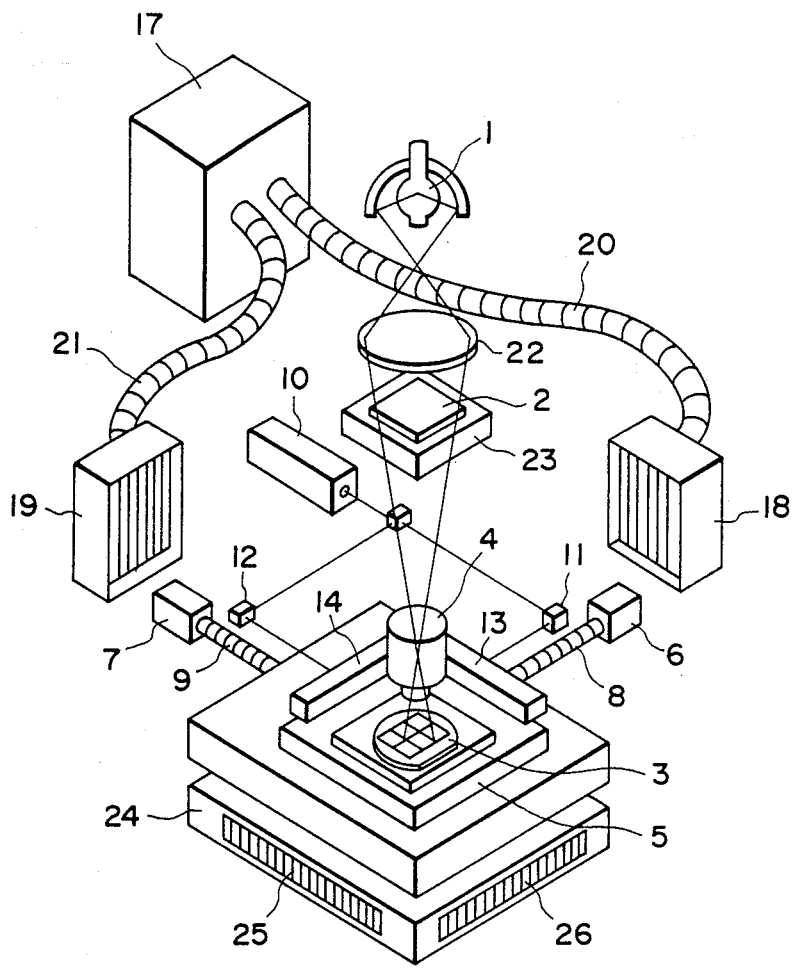
FIG. 2 is a perspective view schematically showing a semiconductor device manufacturing exposure apparatus according to another embodiment of the present invention.

FIG. 2 shows a semiconductor device manufacturing exposure apparatus according to a second embodiment of the present invention. In this embodiment, the first and second air-conditioning devices 15 and 16 used in the FIG. 1 embodiment are replaced by a combination of a common air-conditioning device 17, first and second blow-off units 18 and 19 and air-supplying ducts 20 and 21. The first blow-off unit 18 is adapted to discharge the temperature-controlled air to an X-Y stage 5 in the X direction. On the other hand, the second blow-off unit 99 is arranged to discharge a temperature-controlled air to the X-Y stage 5 in the Y direction.

With the arrangement of the FIG. 2 embodiment, only one air-conditioning device such as the device 17 is required to supply currents of temperature-controlled air to the X-Y stage 5 along two, X and Y directions and thereby to substantially eliminates undesirable temperature irregularities. Thus the structure can be made quite simple. Additionally, it is very easy to assure exactly the same temperature for the currents of air flowing in the X and Y directions, respectively. In this embodiment, only one temperature sensor may be provided in the neighborhood of one of the blow-off units 18 and 19 so that the air-conditioning device 17 may operate to control the temperature of the air flowing out of the blow-off units 18 and 19 on the basis of the sensing by the temperature sensor.

In each of the first and second embodiments described with reference to FIGS. 1 and 2, the whole structure of the exposure apparatus or a portion thereof may be accommodated in a chamber with an advantageous result of further reduction of the effect of the environmental temperature. Further, in each of the embodiments shown in FIGS. 1 and 2, the exposure apparatus may be used with a suitable chamber so that the air-conditioning device or devices for ensuring blow-off in two directions may be disposed within the chamber.

In accordance with the present invention, as described hereinbefore, currents of temperature-controlled air are supplied along two directions which are parallel to or substantially parallel to the X-direction measuring light path and the Y-direction measuring light path of the laser interferometer measuring system, respectively. Accordingly, undesirable temperature irregularities can be avoided substantially completely, with the result that the position measuring accuracy for the X-Y stage can be improved remarkably. As a consequence, it is made practicable to accomplish accurate exposures with improved alignment accuracy of the exposure apparatus, substantially free from the effect of temperature conditions or the like.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing, in sequence, different portions of a workpiece to a pattern with radiation, said apparatus comprising:
    a workpiece carrying stage for carrying thereon the workpiece;
    driving means for moving said workpiece carrying stage in each of first and second directions;
    measuring means operable to detect the position of said workpiece carrying stage with respect to said first direction by use of interference of a laser beam travelling along a first measuring path and also to detect the position of said workpiece carrying stage with respect to said second direction by use of interference of a laser beam travelling along a second measuring path; and
    gas supplying means having first and second blow-off openings and being operable to supply a flow of gaseous fluid from said first blow-off opening toward said workpiece carrying stage in a direction substantially parallel to said first measuring path and also to supply a flow of gaseous fluid from said second blow-off opening toward said workpiece carrying stage in a direction substantially parallel to said second measuring path.

2. An apparatus according to claim 1, wherein said gas supplying means has a temperature controlling function so as to establish the same temperature in the gaseous fluids discharged from said first and second blow-off openings.

3. An exposure apparatus for exposing, in sequence, different portions of a workpiece to a pattern with radiation, said apparatus comprising:
    a workpiece carrying stage for carrying thereon the workpiece;
    driving means for moving said workpiece carrying stage in each of first and second directions;
    measuring means operable to detect the position of said workpiece carrying stage with respect to said first direction by use of interference of a laser beam travelling along a first measuring path and also to detect the position of said workpiece carrying stage with respect to said second direction by use of interference of a laser beam travelling along a second measuring path;
    gas supplying means having first and second blow-off openings and being operable to supply a flow of gaseous fluid from said first blow-off opening toward said workpiece carrying stage in a direction substantially parallel to said first measuring path and also to supply a flow of gaseous fluid from said second blow-off opening toward said workpiece carrying stage in a direction substantially parallel to said second measuring path; and
    suction means provided at a side of said workpiece carrying stage remote from a side upon which the workpiece is placed, for attracting by suction the gaseous fluids blown from said first and second blowoff openings.

* * * * *

UNITED STATES PATENT AND TRADEMARK OFFICE
CERTIFICATE OF CORRECTION

PATENT NO. : 4,814,625
DATED : March 21, 1989
INVENTOR(S) : SHUICHI YABU

It is certified that error appears in the above-identified patent and that said Letters Patent is hereby corrected as shown below:

COLUMN 1

Line 62, "not" should be deleted.

COLUMN 4

Line 46, "unit 99" should read --unit 19-- and "a" should read --the--.
    Line 52, "eliminates" should read --eliminate--.

COLUMN 6

Line 42, "blowoff" should read --blow-off--.

Signed and Sealed this

Twentieth Day of March, 1990

Attest:

JEFFREY M. SAMUELS

*Attesting Officer*    *Acting Commissioner of Patents and Trademarks*